United States Patent
Nagano et al.

(10) Patent No.: US 7,071,833 B2
(45) Date of Patent: Jul. 4, 2006

(54) FAILURE ANALYZING SYSTEM AND METHOD FOR DISPLAYING THE FAILURE

(75) Inventors: Katsuhito Nagano, Tokyo (JP); Shuichiro Ogawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 83 days.

(21) Appl. No.: 10/869,821

(22) Filed: Jun. 16, 2004

(65) Prior Publication Data

US 2005/0270165 A1 Dec. 8, 2005

(30) Foreign Application Priority Data

Jun. 7, 2004 (JP) ............................. 2004-168939

(51) Int. Cl.
*G08B 21/00* (2006.01)

(52) U.S. Cl. ...................... 340/635; 340/653; 356/394; 365/201

(58) Field of Classification Search ................ 340/635, 340/652, 653, 654; 365/200, 201; 257/E21.525, 257/E21.526, 48; 324/750, 752; 356/237.1, 356/388, 394

See application file for complete search history.

(56) References Cited

U.S. PATENT DOCUMENTS

| | | | | |
|---|---|---|---|---|
| 5,493,236 A | * | 2/1996 | Ishii et al. ................... | 324/752 |
| 5,760,892 A | * | 6/1998 | Koyama .................. | 356/237.1 |
| 5,994,715 A | * | 11/1999 | Ide .............................. | 257/48 |
| 6,016,278 A | * | 1/2000 | Tsutsui et al. .............. | 365/200 |
| 6,388,747 B1 | * | 5/2002 | Nara et al. ................... | 356/394 |
| 6,421,122 B1 | * | 7/2002 | Nara et al. ................... | 356/394 |
| 6,476,913 B1 | * | 11/2002 | Machida et al. ............ | 356/394 |
| 6,480,279 B1 | * | 11/2002 | Nara et al. ................... | 356/394 |
| 6,504,609 B1 | * | 1/2003 | Nara et al. ................... | 356/394 |
| 6,532,182 B1 | * | 3/2003 | Ogawa et al. .............. | 365/201 |
| 6,567,168 B1 | * | 5/2003 | Nara et al. ................... | 356/394 |
| 6,759,655 B1 | * | 7/2004 | Nara et al. ................... | 250/310 |

* cited by examiner

*Primary Examiner*—Van T. Trieu
(74) *Attorney, Agent, or Firm*—Osha Liang LLP

(57) ABSTRACT

A failure analyzing system for displaying a position of a failure in a semiconductor device, includes: a circuit position memory for storing physical positions of respective circuits included in the semiconductor device; a defective information acquisition unit for acquiring information on a defective circuit included in the semiconductor device; and a display for displaying the defective circuit on a layout of the semiconductor device with a color that is different between the physical positions.

13 Claims, 6 Drawing Sheets

FAILURE ANALYZING SYSTEM AND METHOD FOR DISPLAYING THE FAILURE

This patent application claims priority from a Japanese Patent Application No. 2004-168939 filed on Jun. 7, 2004, the contents of which are incorporated herein by reference.

BACKGROUND OF THE INVENTION

1. Field of the Invention

The present invention relates to a failure analyzing system and a method for displaying a failure. More particularly, the present invention relates to a failure analyzing system and a method for displaying a failure that can display a position of a failure in a semiconductor device.

2. Description of the Related Art

ATPG (Auto Test Pattern Generation) generates a test program and a pattern program for testing a semiconductor device and supplies them to a semiconductor test device. The semiconductor test device tests the semiconductor device with the test program and the pattern program that were generated by the ATPG, and outputs failure data to the ATPG as a result of the test. The ATPG then detects a defective circuit existing in that semiconductor device based on the failure data output from the semiconductor test device and generates a list of possible defective circuits.

Moreover, the ATPG further generates a test program and a pattern program for testing the defective circuit existing in the semiconductor device in detail based on the list of possible defective circuits generated by the failure data. By making the semiconductor test device execute a detailed test for the semiconductor device, the defective circuits in the semiconductor device are narrowed down.

According to the ATPG and semiconductor test device described above, the defective circuit in the semiconductor device can be determined. However, it is not possible to determine commonality or tendency of positions of failures between semiconductor devices or a plurality of plates of wafer each having a plurality of semiconductor devices formed thereon. Therefore, it is difficult to identify the cause of the defective circuit in the semiconductor device.

SUMMARY OF THE INVENTION

Therefore, it is an object of the present invention to provide a failure analyzing system and a method for displaying a failure, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a failure analyzing system for displaying a position of a failure in a semiconductor device, comprises: a circuit position memory operable to store physical positions of respective circuits included in the semiconductor device; a defective information acquisition unit operable to acquire information on a defective circuit included in the semiconductor device; and a display operable to display the defective circuit on a layout of the semiconductor device with a color that is different between the physical positions.

The defective circuit information acquisition unit may acquire a failure classification of the defective circuit included in the semiconductor device, and the display may display the defective circuit on a layout of wafer including layouts of a plurality of semiconductor devices with a color that is different between the physical positions and failure classifications.

The circuit position memory may further store, for respective semiconductor devices on wafer, physical positions on the wafer of the semiconductor devices, and the display may display the defective circuit on a layout of the wafer including layouts of a plurality of semiconductor devices with a color that is different between the physical positions.

The circuit position memory may store for each of circuits included in a multilayer semiconductor device a layer in which the circuit is formed, and the display may display the defective circuit with a color depending on a layer in which the defective circuit is formed.

The circuit position memory may store for each of wirings included in the semiconductor device a layer in which the wiring is formed, the defective circuit information acquisition unit may acquire information on a defective wiring included in the semiconductor device, and the display may display the defective wiring with a color that is different depending on a layer in which the defective wiring is formed.

The display may display layouts of a plurality of plates of wafer managed in the same lot while arranging the layouts on one display screen, and may display defective circuits of the plurality of semiconductor devices included in each of the plurality of plates of wafer on a layout of the wafer with colors that depend on physical positions of the defective circuits.

The display may display layouts of a plurality of plates of wafer managed by the same slot in different lots while arranging them on one display screen, and may display defective circuits of a plurality of semiconductor devices included in each of the plurality of plates of wafer on a layout of that wafer with colors depending on physical positions of the defective circuits.

The failure analyzing system may further comprise: a user interface operable to allow a user to select the defective circuit displayed by the display on the layout of the semiconductor device; and a test-execution instruction unit operable to instruct a semiconductor test device to execute a more detailed test for the defective circuit selected by the user, wherein the defective circuit information acquisition unit acquires information on the defective circuit, that was obtained by the more detailed test by the semiconductor test device, and the display displays the defective circuit on the layout of the semiconductor device with a color that is different between the physical positions.

According to the second aspect of the present invention, a failure analyzing system for displaying a position of a failure in a multilayer semiconductor device, comprises: a circuit position memory operable to store, for each of circuits included in the semiconductor device, a layer in which the circuit is formed; a defective circuit information acquisition unit operable to acquire information on a defective circuit included in the semiconductor device; and a display operable to display the defective circuit on a layout of the semiconductor device in a display format that is different between the layers.

The defective circuit information acquisition unit may acquire a failure classification of the defective circuit included in the semiconductor device, and the display may display the defective circuit on the layout of the semiconductor device in the display format that is different depending on a layer in which the defective circuit is formed and the failure classification of the defective circuit.

The circuit position memory may further store, for respective semiconductor devices, physical positions in wafer of the semiconductor devices and the display may display the defective circuit on a layout of the wafer including layouts of the semiconductor devices in the display format that is different between physical positions.

According to the third aspect of the present invention, a failure position displaying method for displaying a position of a failure in a semiconductor device, comprises: acquiring information on a defective circuit included in the semiconductor device; referring to a circuit position memory operable to store physical positions in the semiconductor device of respective circuits included in the semiconductor device and searching a physical position of the defective circuit; and displaying the defective circuit on a layout of the semiconductor device with a color that is different between the physical positions.

According to the fourth aspect of the present invention, a failure position displaying method for displaying a position of a failure in a multilayer semiconductor device, comprises: acquiring information on a defective circuit included in the semiconductor device; referring to a circuit position memory operable to store for respective circuits included in the semiconductor device layers in which the respective circuits are formed and searching a layer in which the defective circuit is formed; and displaying the defective circuit on a layout of the semiconductor device in a display format that is different between the layers.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
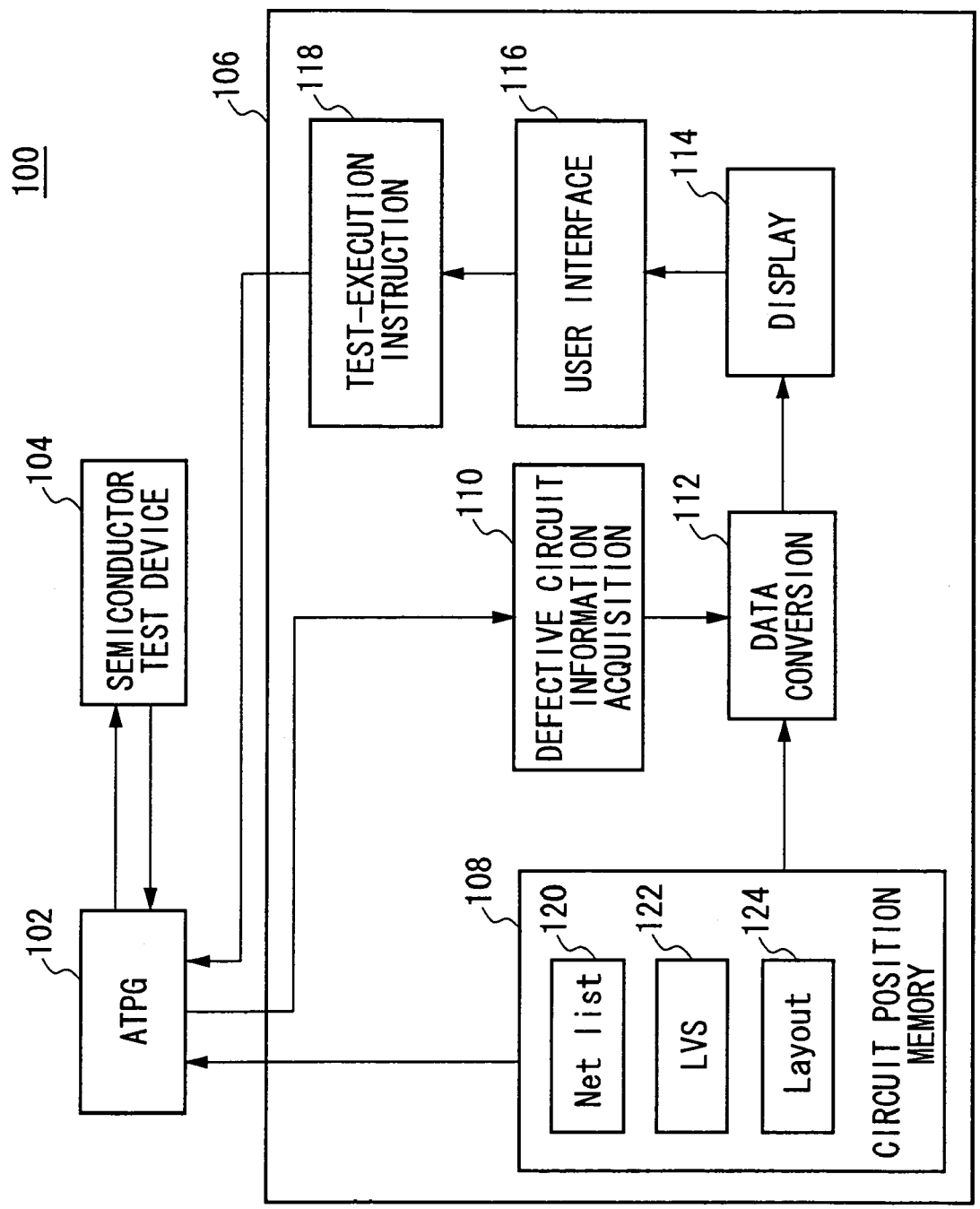
FIG. 1 is a block diagram of a semiconductor test system 100 according to an embodiment of the present invention.

FIG. 1 is a block diagram of an exemplary semiconductor test system 100 according to an embodiment of the present invention. The semiconductor test system 100 includes an ATPG 102, a semiconductor test device 104 and a failure analyzing system 106. The failure analyzing system 106 includes a circuit position memory 108, a defective circuit information acquisition unit 110, a data conversion unit 112, a display 114, a user interface 116 and a test-execution instruction unit 118. The circuit position memory 108 stores therein NetList 120, LVS (Layout Versus Schematic) 122 and Layout 124.

The ATPG 102 generates a test program and a pattern program for testing a semiconductor device and supplies them to the semiconductor test device 104. The ATPG 102 also generates a test program and a pattern program in accordance with a request from the test-execution instruction unit 118 of the failure analyzing system 106, and supplies them to the semiconductor test device 104.

The semiconductor test device 104 tests a semiconductor device with the test program and pattern program generated by the ATPG 102 and outputs failure data as a result of the test to the ATPG 102. The ATPG 102 then detects a defective circuit in the semiconductor device based on the failure data output from the semiconductor test device 104 and NetList 120 stored in the circuit position memory 108, and supplies the detection result to the defective circuit information acquisition unit 110 of the failure analyzing system 106.

The failure analyzing system 106 acquires information on the defective circuit detected by the ATPG 102, and displays a position of a failure and a classification of the failure in the semiconductor device so as for a user to easily understand them. More specifically, the failure analyzing system 106 functions in the following manner.

The circuit position memory 108 stores a physical position in wafer of each of semiconductor devices that is an object of a test. The circuit position memory 108 also stores physical positions in the semiconductor device of respective circuits included in the semiconductor device that is the object of the test. For example, the circuit position memory 108 stores for each of circuits included in the semiconductor device having a multilayer structure, a layer in which that circuit is formed. Please note that the circuits mean a device such as a transistor, a memory such as a RAM, and a wiring for connecting the devices or memories. For example, the circuit position memory 108 stores, for each of wirings included in the semiconductor device, a layer in which that wiring is formed as a physical position of that wiring. NetList 20 describes logical connection between circuits formed in the semiconductor device. Layout 24 describes a physical arrangement of the circuits formed in the semiconductor device. LVS 122 describes a relationship between the logical connection of the circuits that is described by NetList 120 and the physical circuit arrangement described by Layout 24.

The defective circuit information acquisition unit 110 acquires information on a defective circuit included in the semiconductor device, that was supplied from the ATPG 102. The defective circuit information acquisition unit 110 may acquire the information on a defective circuit directly from the semiconductor test device 104, for example, in a case where the semiconductor test device 104 performs a scan test. For example, the defective circuit information acquisition unit 110 acquires information on a defective device included in the semiconductor device, information on a defective memory, information on a defective wiring, information on classification of a failure and the like. Please note that the classification of a failure is the reason for the failure of the defective circuit such as short-circuit, open or delay.

The data conversion unit 112 generates data of layout of entire wafer that includes circuit layouts of a plurality of semiconductor devices based on NetList 120, LVS 122 and Layout 124 stored in the circuit position memory 108. The data conversion unit 112 also refers to NetList 120, LVS 122 and Layout 124 stored in the circuit position memory 108 and generates data that is displayed in such a manner that a user can easily figure out the physical position of the defective circuit visually, based on the information on the defective circuit acquired by the defective circuit information acquisition unit 110.

The display 114 displays the defective circuit on the layout of the wafer including layouts of a plurality of semiconductor devices based on the data generated by the data conversion unit 112, in such a manner that the defective circuit is displayed in a manner that depends on its physical position. For example, the display 114 displays the defective wiring on the layout of the wafer including layouts of a plurality of semiconductor devices, with a color that is different between layers. Thus, by displaying the defective circuit with a color that is different between physical positions such as layers on the layouts of the wafer and semiconductor devices, the user can figure out the reason for the failure of that circuit intuitively or visually.

The user interface 116 allows the user to select the defective circuit displayed on the layout of the semiconductor device by the display 114. For example, the user interface 116 allows the user to select the defective circuit displayed by the display 114 on the display screen by means of a mouse or the like. Then, the test-execution instruction unit 118 requests the ATPG 102 to make the semiconductor test device 104 execute a more detailed test for the defective circuit selected by the user. As described above, since the defective circuit can be narrowed down by selection by the user, a test can be performed flexibly in accordance with an object of failure analysis.

Figure 2:
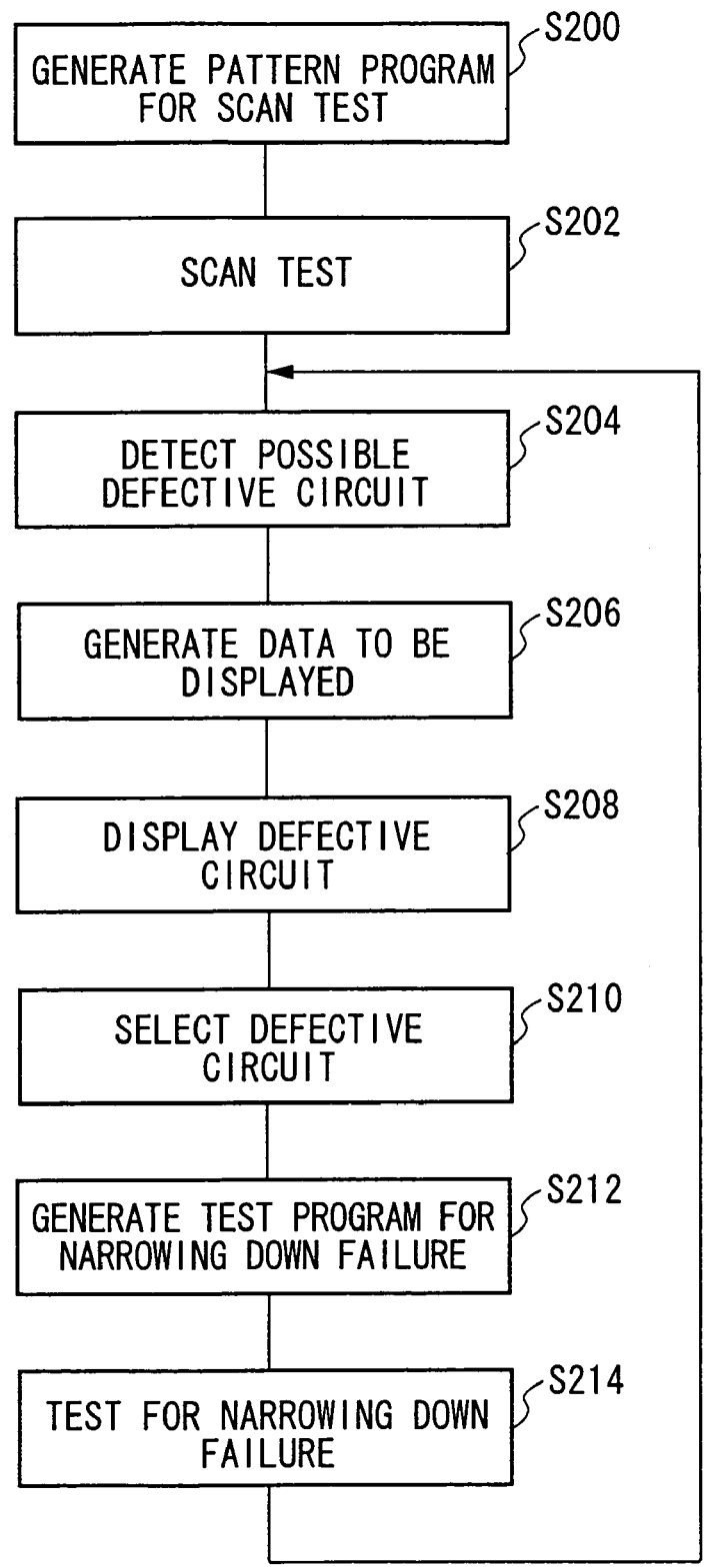
FIG. 2 shows a flow of a failure analyzing method performed by the semiconductor test system 100.

FIG. 2 shows an exemplary flow of the failure analyzing method by the semiconductor test system 100 according to the present embodiment. The failure analyzing method of the present embodiment is an exemplary method for displaying a position of a failure of the present invention.

The ATPG 102 generates a pattern program and a test program for executing a scan test for circuits formed in a semiconductor device (Step S200). Then, the semiconductor test device 104 executes the scan test for the circuits formed in the semiconductor device based on the pattern program and test program generated by the ATPG 102 (Step S202).

Then, the ATPG 102 refers to NetList 120 stored in the circuit position memory 108 so as to detect possible defective circuits in the semiconductor device based on failure data output from the semiconductor test device 104 (Step S204).

The defective circuit information acquisition unit 110 then acquires information on possible defective circuits detected by the ATPG 102. The data conversion unit 112 then refers to the circuit position memory 108 that stores physical positions in the semiconductor device of the respective circuits included in the semiconductor device, thereby searching the physical position of the defective circuit acquired by the defective circuit information acquisition unit 110 and creating display data having a format in accordance with the physical position of that defective circuit (Step S206). For example, the data conversion unit 112 refers to the circuit position memory 108 that stores for each of the circuits included in the multilayer semiconductor device a layer in which that circuit is formed, thereby searching the layer in which the defective circuit acquired by the defective circuit information acquisition unit 110 is formed and creating the display data having the display format that depends on the layer in which that defective circuit is formed (Step S206). More specifically, the defective circuit acquisition unit 110 creates the display data having the display format in which the layer including the defective circuit therein is displayed with a color that is different between layers (Step S206).

Then, the display 114 displays the defective circuit on a layout of wafer including layouts of a plurality of semiconductor devices based on the display data created by the data conversion unit 112 in the display format that is varied depending on the physical position of that defective circuit (Step S208). For example, the display 114 displays the defective circuit on the layout of the wafer including the layout of the multilayer semiconductor device in the display format that depends on the layer in which that defective circuit is formed. More specifically, the display 114 displays the defective circuit with a color that is different between layers (Step S208). In this manner, the user can figure out a general distribution of failures existing in a plurality of semiconductor devices formed in the wafer.

Then, in order to narrow down the defective circuits by a detailed test by the ATPG 102 and the semiconductor test device 104, the user selects a possible defective circuit on the layout displayed by the display 114 (Step S210). The test-execution instruction unit 118 sends the ATPG 102 information on the possible defective circuit selected by the user, thereby requesting the ATPG 102 to make the semiconductor test device 104 execute the more detailed test for that possible defective circuit.

The ATPG 102 then generates a pattern program and a test program for executing a failure refining test for the possible defective circuit selected by the user (Step S212). The semiconductor test device 104 then executes the failure refining test for the possible defective circuit selected by the user based on the pattern program and test program generated by the ATPG 102 (Step S214).

The ATPG 102 refers to NetList 120 stored in the circuit position memory 108 so as to detect a definite defective circuit from the possible defective circuits selected by the user based on the failure data output from the semiconductor test device 104 (Step S204).

Then, the defective circuit information acquisition unit 110 acquires information on the defective circuit obtained by the more detailed test executed by the semiconductor test device 104, from the ATPG 102. The data conversion unit 112 then refers to the circuit position memory 108 that stores physical positions of respective circuits included in the semiconductor device, thereby searching the physical position of the defective circuit acquired by the defective circuit information acquisition unit 110 and creating display data having a display format that depends on the physical position and failure classification of that defective circuit (Step S206). For example, the data conversion unit 112 refers to the circuit position memory 108 that stores, for each of circuits included in the multilayer semiconductor device, a layer in which that circuit is formed, thereby searching the layer in which the defective circuit acquired by the defective circuit information acquisition unit 110 is formed and creating the display data having the display format that depends on the layer including that defective circuit therein and the failure classification of that defective circuit (Step S206). More specifically, the defective circuit information acquisition unit 110 creates the display data having the display format in which a defective wiring that is an exemplary defective circuit is displayed with a color depending on the layer in which that wiring is formed and the failure classification of that wiring (Step S206).

The display 114 then displays the defective circuit on the layout of the semiconductor device based on the display data created by the data conversion unit 112, in the display format that depends on the physical position and failure classification of that defective circuit (Step S208). For example, the display 114 displays the defective circuit on the layout of the multilayer semiconductor device in the display format that depends on the layer in which that defective circuit is formed and the failure classification of that defective circuit. More specifically, the display 114 displays a defective wiring that is an exemplary defective circuit with a color depending on the layer including that defective wiring therein and the failure classification of that defective wiring (Step S208). Thus, the user can refine a failure for the selected possible defective circuits and can figure out a detailed distribution of failures. By repeating Steps S204–S214 a plurality of number times, failure refinement can be performed for the possible defective circuit. Moreover, since the user can arbitrarily select the possible defective circuit for which the failure refinement is performed in accordance with the object of failure analysis, it is possible to effectively use the ATPG 102. Thus, failure analysis in a desired manner can be performed rapidly.

In this example, the possible defective circuits is detected by the scan test and thereafter the failure refining test is executed for the possible defective circuit selected by the user, thereby a definite defective circuit is detected. In another example, the defective circuit may be detected by detecting a circuit block including a defective circuit by a function test and then executing a failure refining test such as a scan test for circuits included in the circuit block selected by the user.

Figure 3:
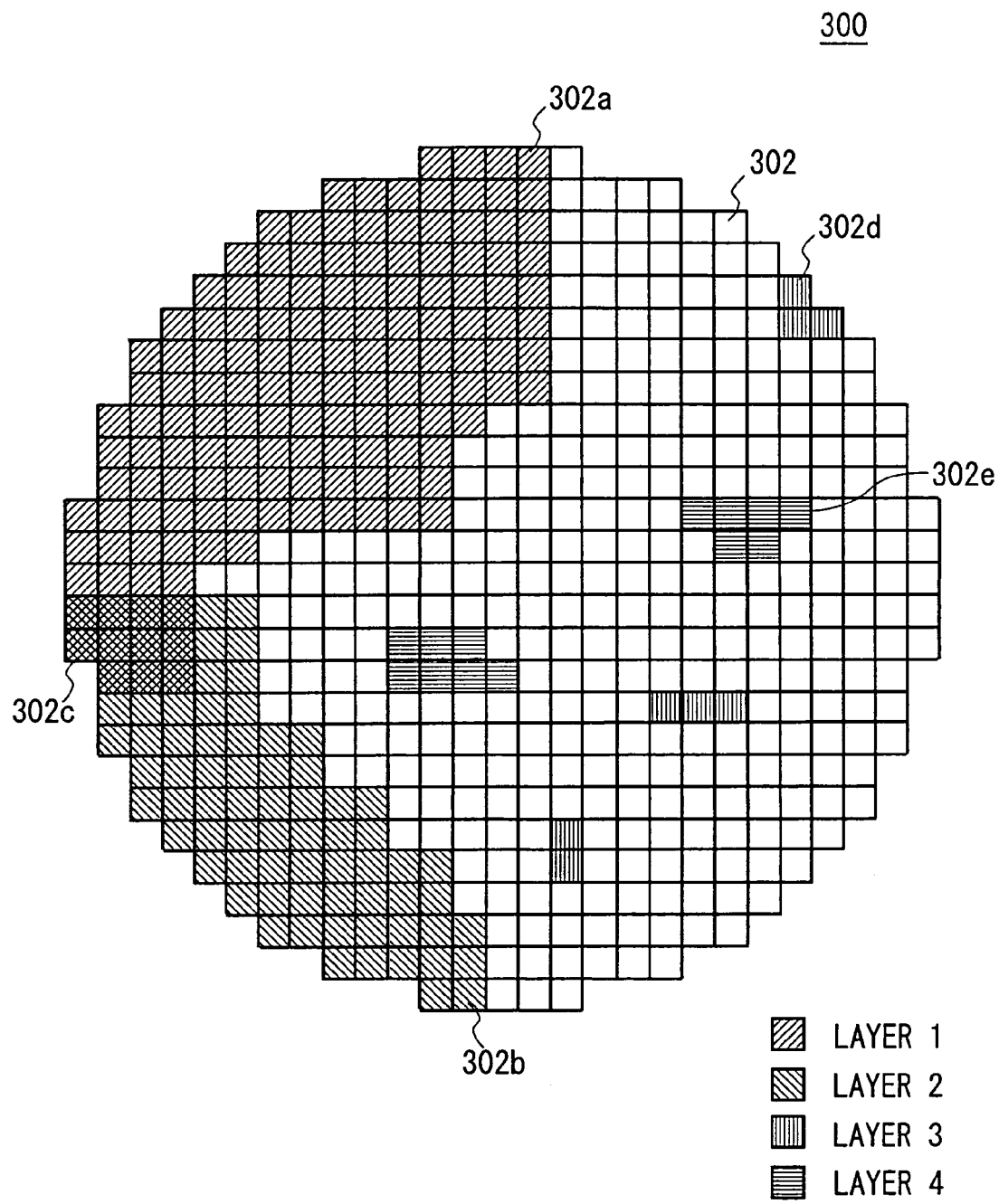
FIG. 3 shows an exemplary display screen of a display 114.
Figure 4:
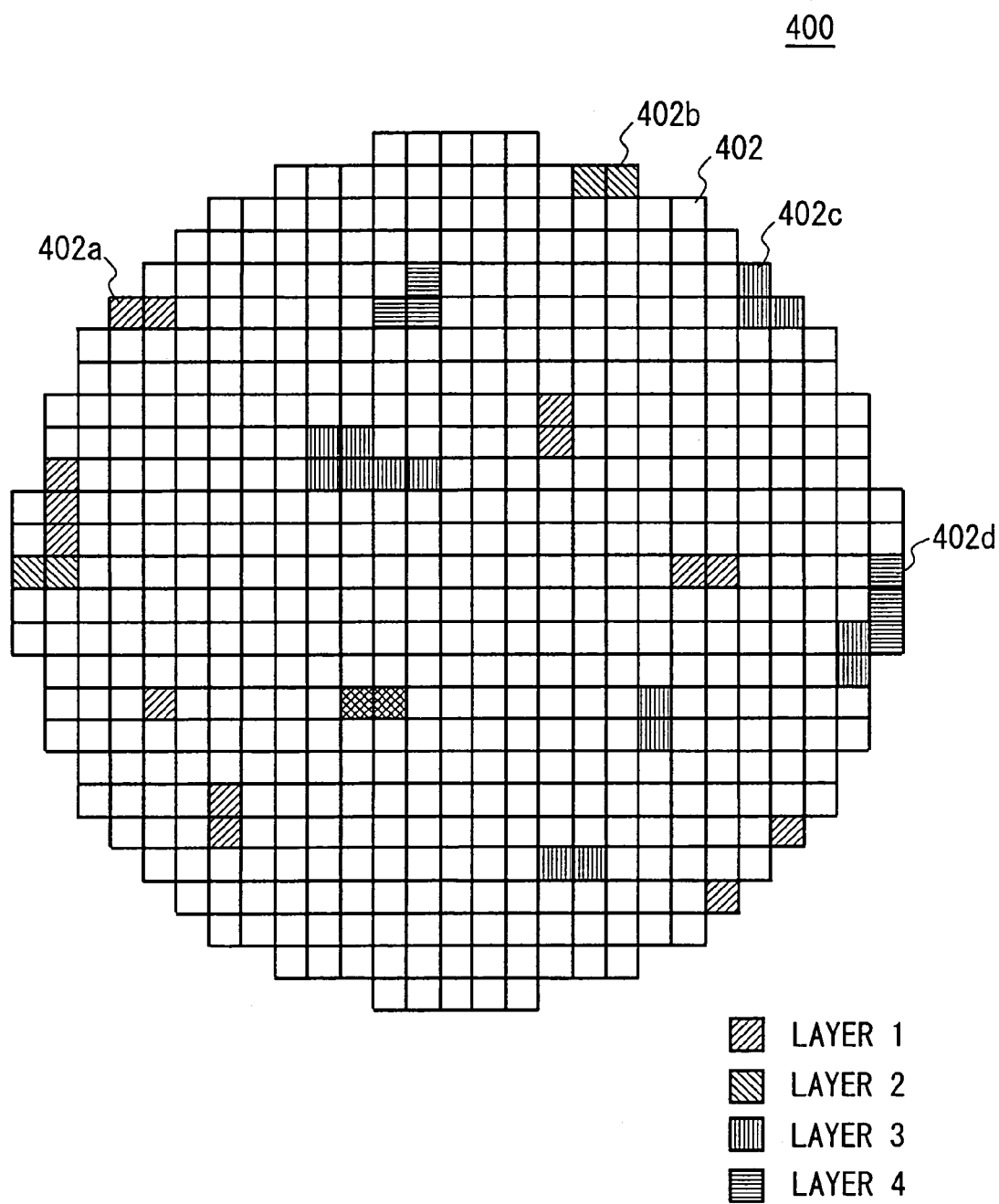
FIG. 4 shows another exemplary display screen of the display 114.

FIGS. 3 and 4 illustrate exemplary display screens of the display 114 according to the present embodiment. The display 114 displays layout of wafer 300 or 400 that includes layout of a plurality of semiconductor devices 302 or 402. The display 114 displays a defective circuit detected by the ATPG 102 on the layout of the wafer 300 or 400 in the display format depending on the physical position and failure classification of the defective circuit.

As shown in FIGS. 3 and 4, the display 114 displays a color that is different depending on the layer including the defective circuit therein on the layout of the wafer 300 or 400. More specifically, FIG. 3 shows that a semiconductor device 302a and the like include a defective circuit in Layer 1; a semiconductor device 302 and the like include a defective circuit in Layer 2; a semiconductor device 302c and the like include defective circuits in Layers 1 and 2; a semiconductor device 302d include a defective circuit in Layer 31 and a semiconductor device 302e and the like include a defective circuit in Layer 4. FIG. 4 shows that a semiconductor device 402a and the like include a defective circuit in Layer 1; a semiconductor device 402b and the like include a defective circuit in Layer 2; a semiconductor device 402c and the like include a defective circuit in Layer 3; and a semiconductor device 402d and the like include a defective circuit in Layer 4.

In other words, on the wafer 300 shown in FIG. 3, there is a tendency of failure distribution in a plane of the wafer 300. On the other hand, on the wafer 400 shown in FIG. 4, there is no tendency of failure distribution in a plane of the wafer 400. Thus, from the failure distribution on the wafer 300 shown in FIG. 3, it can be predicted that the wafer 300 was not flattened with high precision, etchant was not applied onto the wafer 300 uniformly, temperature distribution in the plane of the wafer 300 was not uniform, and the like, and composition of manufacturing defects can be determined from the prediction. On the other hand, from the failure distribution on the wafer 400 shown in FIG. 4, it can be predicted that the semiconductor devices were improperly designed, mechanical flaws and the like are scattered, and the like. Moreover, in a case of focusing attention on the failure classification, a defective via or the like can be predicted.

As described above, by displaying the defective circuits on the layouts of the wafer 300 and the wafer 400 and displaying the defective circuits with colors depending on the layers of the wafer 300 and the wafer 400 in which the respective defective circuits are included, failure distribution can be easily determined visually. Thus, it is possible to precisely predict the causes of the defective circuits in the wafer 300 and the wafer 400.

Figure 5:
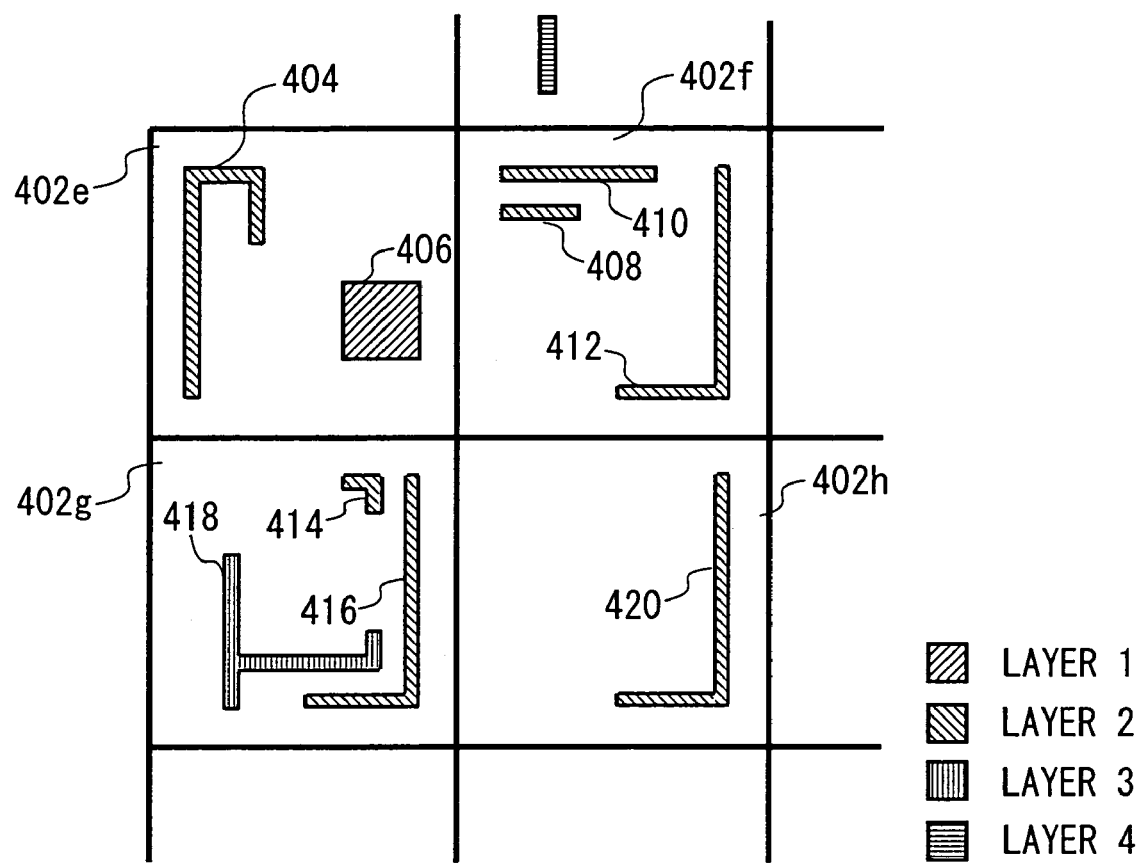
FIG. 5 shows still another exemplary display screen of the display 114.

FIG. 5 illustrates an exemplary display screen of the display 114. In FIG. 5, a part of the layout of the wafer 400 shown in FIG. 4 is enlarged. In FIG. 4, a color that is different between the layers is displayed for the entire surface of the semiconductor device 402. In more detail, a defective circuit is displayed at its physical position in an in-plane direction in each semiconductor device 402 with a color depending on its position in an out-of-plane direction, i.e., a layer.

More specifically, the semiconductor device 402e includes a defective wiring 406 in Layer 1 and a defective circuit block 404 in Layer 2; the semiconductor device 402f includes defective wirings 408, 410 and 412 in Layer 2; the semiconductor device 402g includes defective wirings 414 and 416 in Layer 2 and a defective wiring 418 in Layer 3; and the semiconductor device 402h includes a defective wiring 420 in Layer 2. The display 114 may display a plurality of semiconductor devices in which defective circuits are displayed while the semiconductor devices are overlapped. By displaying the defective wiring on the actual layout of the semiconductor devices 402 in this manner, failures of circuits that are common to the semiconductor devices can be figured out. For example, in a case where a plurality of semiconductor devices include common defects like the defective wirings 412, 416 and 420, it is predicted that a manner in which the wirings are formed has a problem.

Figure 6:
FIG. 6 shows still another exemplary display screen of the display 114.
Figure 6:
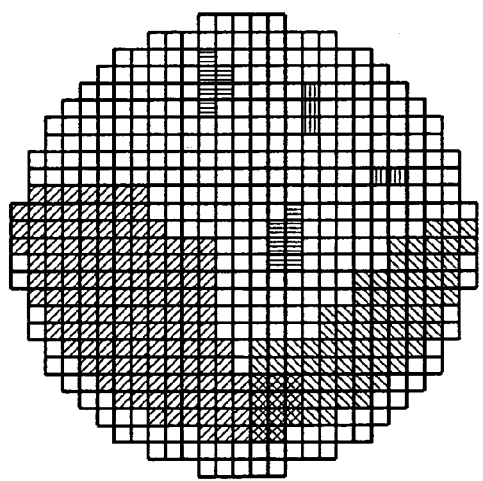
Figure 6:
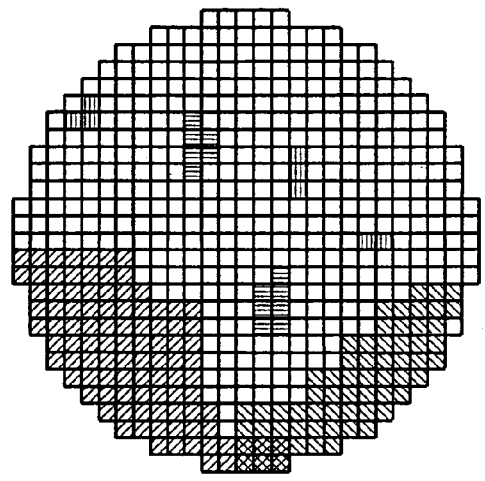
Figure 6:
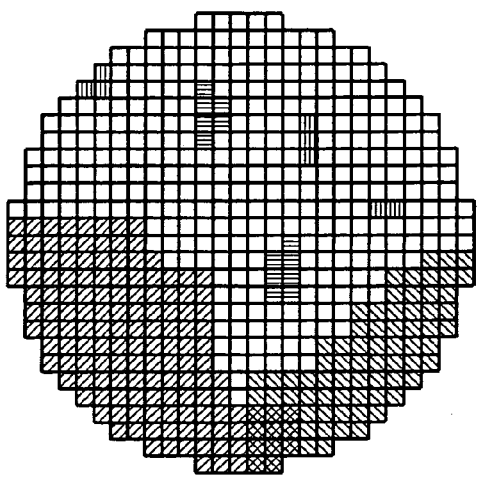
Figure 6:
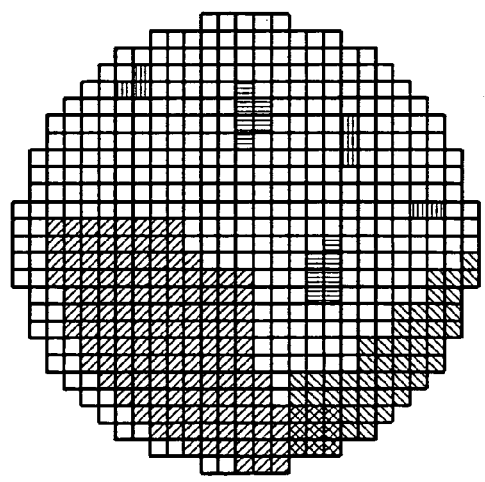

FIG. 6 shows an exemplary display screen of the display 114 according to the present embodiment. The display 114 may display layouts of a plurality of plates of wafer that are managed in the same lot while arranging them in one display screen. In this case, defective circuits of a plurality of semiconductor devices included in each plate of wafer may be displayed on the layout of that wafer in display formats that are different between physical positions of the defective circuits on the wafer, for example, with different colors. Moreover, the display 114 may display the layouts of a plurality of plates of wafer managed in the same lot while overlapping those layouts. The above-described display methods enables the user to easily figure out the tendency of the failure distribution caused by a difference between slot positions or the like.

Furthermore, while displaying the layouts of a plurality of plates of wafer that are managed by the same slots in different lots in one display screen, the display 114 may display, on the layout of each plate of wafer, defective circuits of a plurality of semiconductor devices included in that wafer in display formats that are different between the physical positions in that wafer of the defective circuits, for example, with different colors. The display 114 may display the layouts of a plurality of plates of wafer that are managed by the same slots in different lots while overlapping them. Such display methods enables the user to easily figure out the tendency of the failure distribution caused by a difference between lots.

Although the present invention has been described by way of exemplary embodiments, it should be understood that those skilled in the art might make many changes and substitutions without departing from the spirit and the scope of the present invention which is defined only by the appended claims.

What is claimed is:

1. A failure analyzing system for displaying a position of a failure in a semiconductor device, comprising:

a circuit position memory operable to store physical positions of respective circuits included in the semiconductor device;

a defective information acquisition unit operable to acquire information on a defective circuit included in the semiconductor device; and a display operable to display the defective circuit on a layout of the semiconductor device with a color that is different between the physical positions.

2. A failure analyzing system as claimed in claim 1, wherein said defective circuit information acquisition unit acquires a failure classification of the defective circuit included in the semiconductor device, and said display displays the defective circuit on a layout of wafer including layouts of a plurality of semiconductor devices with a color that is different between the physical positions and failure classifications.

3. A failure analyzing system as claimed in claim 1, wherein said circuit position memory further stores, for respective semiconductor devices on wafer, physical positions on the wafer of the semiconductor devices, and said display displays the defective circuit on a layout of the wafer including layouts of a plurality of semiconductor devices with a color that is different between the physical positions.

4. A failure analyzing system as claimed in claim 3, wherein said circuit position memory stores for each of circuits included in a multilayer semiconductor device a layer in which the circuit is formed, and said display displays the defective circuit with a color depending on a layer in which the defective circuit is formed.

5. A failure analyzing system as claimed in claim 4, wherein said circuit position memory stores for each of wirings included in the semiconductor device a layer in which the wiring is formed, said defective circuit information acquisition unit acquires information on a defective wiring included in the semiconductor device, and said display displays the defective wiring with a color that is different depending on a layer in which the defective wiring is formed.

6. A failure analyzing system as claimed in claim 3, wherein said display displays layouts of a plurality of plates of wafer managed in the same lot while arranging the layouts on one display screen, and displays defective circuits of the plurality of semiconductor devices included in each of the plurality of plates of wafer on a layout of the wafer with colors that depend on physical positions of the defective circuits.

7. A failure analyzing system as claimed in claim 3, wherein said display displays layouts of a plurality of plates of wafer managed by the same slot in different lots while arranging them on one display screen, and displays defective circuits of a plurality of semiconductor devices included in each of the plurality of plates of wafer on a layout of that wafer with colors depending on physical positions of the defective circuits.

8. A failure analyzing system as claimed in claim 1, further comprising:

a user interface operable to allow a user to select the defective circuit displayed by the display on the layout of the semiconductor device; and a test-execution instruction unit operable to instruct a semiconductor test device to execute a more detailed test for the defective circuit selected by the user, wherein said defective circuit information acquisition unit acquires information on the defective circuit, that was obtained by the more detailed test by said semiconductor test device, and said display displays the defective circuit on the layout of the semiconductor device with a color that is different between the physical positions.

9. A failure analyzing system for displaying a position of a failure in a multilayer semiconductor device, comprising:

a circuit position memory operable to store, for each of circuits included in the semiconductor device, a layer in which the circuit is formed;

a defective circuit information acquisition unit operable to acquire information on a defective circuit included in the semiconductor device; and a display operable to display the defective circuit on a layout of the semiconductor device in a display format that is different between the layers.

10. A failure analyzing system as claimed in claim 9, wherein said defective circuit information acquisition unit acquires a failure classification of the defective circuit included in the semiconductor device, and said display displays the defective circuit on the layout of the semiconductor device in the display format that is different depending on a layer in which the defective circuit is formed and the failure classification of the defective circuit.

11. A failure analyzing system as claimed in claim 9, wherein said circuit position memory further stores, for respective semiconductor devices, physical positions in wafer of the semiconductor devices and said display displays the defective circuit on a layout of the wafer including layouts of the semiconductor devices in the display format that is different between physical positions.

12. A failure position displaying method for displaying a position of a failure in a semiconductor device, comprising:

acquiring information on a defective circuit included in the semiconductor device;

referring to a circuit position memory operable to store physical positions in the semiconductor device of respective circuits included in the semiconductor device and searching a physical position of the defective circuit; and displaying the defective circuit on a layout of the semiconductor device with a color that is different between the physical positions.

13. A failure position displaying method for displaying a position of a failure in a multilayer semiconductor device, comprising:

acquiring information on a defective circuit included in the semiconductor device;

referring to a circuit position memory operable to store for respective circuits included in the semiconductor device layers in which the respective circuits are formed and searching a layer in which the defective circuit is formed; and displaying the defective circuit on a layout of the semiconductor device in a display format that is different between the layers.

* * * * *